US009812538B2

(12) United States Patent
Burke et al.

(10) Patent No.: US 9,812,538 B2
(45) Date of Patent: Nov. 7, 2017

(54) BURIED BUS AND RELATED METHOD

(71) Applicant: Infineon Technologies Americas Corp., El Segundo, CA (US)

(72) Inventors: Hugo Burke, Llantrisant (GB); Ling Ma, Redondo Beach, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 2 days.

(21) Appl. No.: 14/955,299

(22) Filed: Dec. 1, 2015

(65) Prior Publication Data
US 2017/0154970 A1    Jun. 1, 2017

(51) Int. Cl.
*H01L 29/423* (2006.01)
*H01L 29/49* (2006.01)
*H01L 21/768* (2006.01)
*H01L 29/78* (2006.01)

(52) U.S. Cl.
CPC .... *H01L 29/4236* (2013.01); *H01L 21/76877* (2013.01); *H01L 29/495* (2013.01); *H01L 29/4991* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 9,070,661 B2* | 6/2015 | Takewaki | H01L 27/088 |
| 2006/0216895 A1* | 9/2006 | Zeng | H01L 21/76838 |
| | | | 438/270 |
| 2010/0163978 A1* | 7/2010 | Magri | H01L 29/4916 |
| | | | 257/334 |
| 2011/0244673 A1* | 10/2011 | Cho | C23C 16/045 |
| | | | 438/589 |
| 2011/0291183 A1* | 12/2011 | Lin | H01L 29/7813 |
| | | | 257/330 |
| 2012/0070983 A1* | 3/2012 | Rutter | H01L 29/42372 |
| | | | 438/653 |
| 2013/0248986 A1* | 9/2013 | Liu | H01L 29/402 |
| | | | 257/330 |

* cited by examiner

*Primary Examiner* — Marcos D Pizarro
*Assistant Examiner* — Shannon Yi
(74) *Attorney, Agent, or Firm* — Murphy, Bilak & Homiller, PLLC

(57) ABSTRACT

A semiconductor structure includes a semiconductor substrate having a gate electrode in a gate trench, a buried bus in the semiconductor substrate, the buried bus having a bus conductive filler in a bus trench, where the bus conductive filler is electrically coupled to the gate electrode. The bus conductive filler is surrounded by the gate electrode. The gate trench intersects the bus trench in the semiconductor substrate. The gate electrode includes polysilicon. The bus conductive filler includes tungsten. The semiconductor structure also includes an adhesion promotion layer interposed between the bus conductive filler and the gate electrode, where the adhesion promotion layer includes titanium and titanium nitride. The semiconductor structure also includes a dielectric layer covering the gate electrode over the semiconductor substrate, where the buried bus has a coplanar top surface with the dielectric layer.

18 Claims, 6 Drawing Sheets

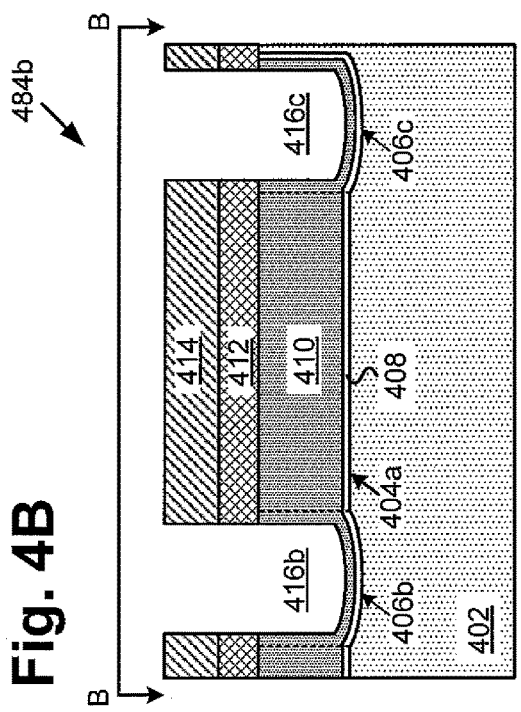
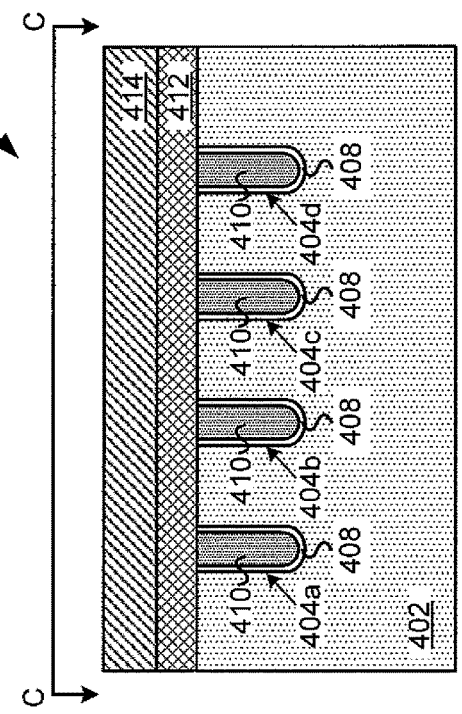
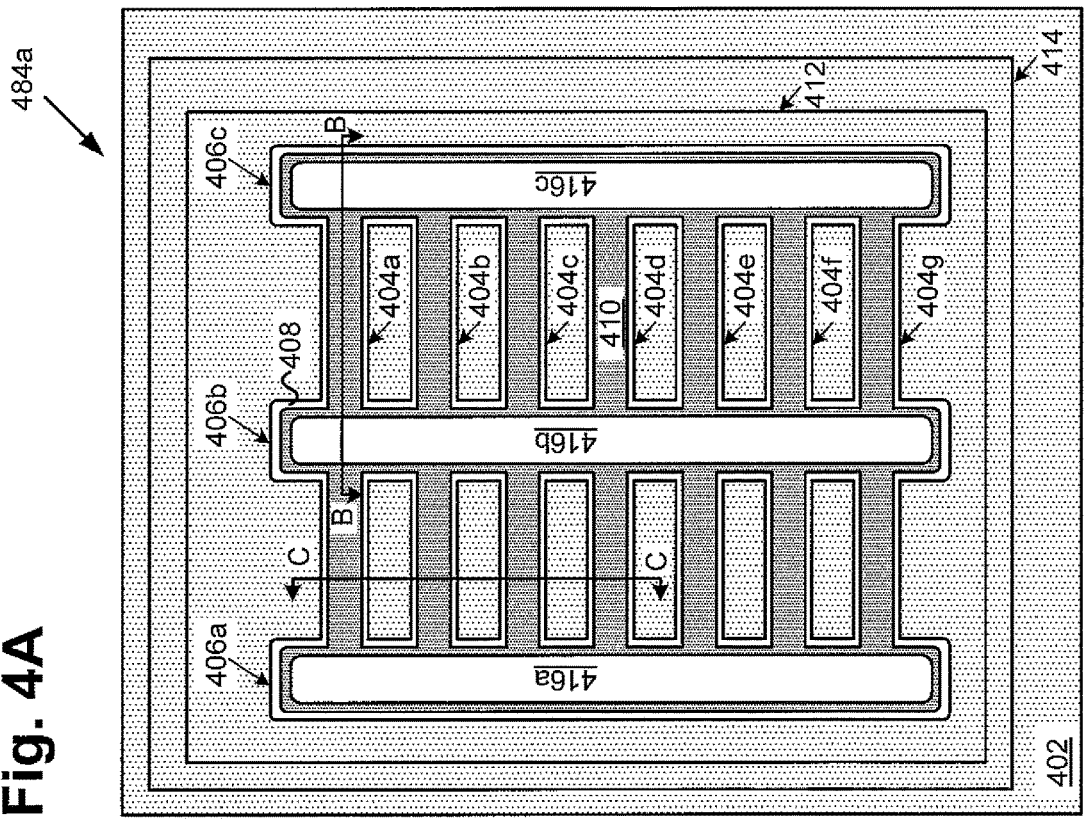
Fig. 4B
Fig. 4C
Fig. 4A

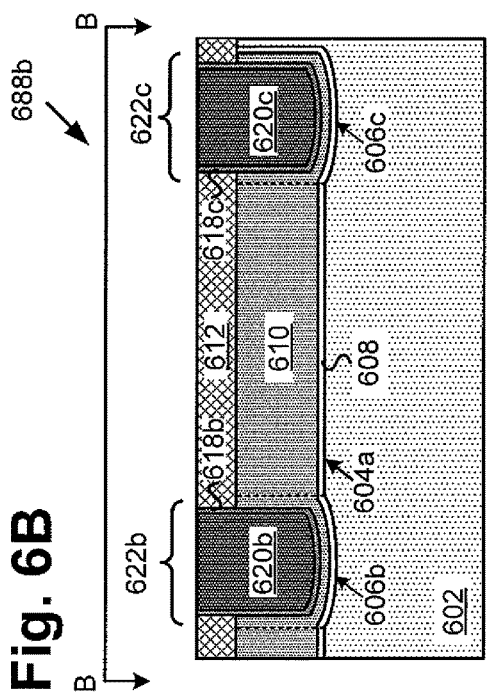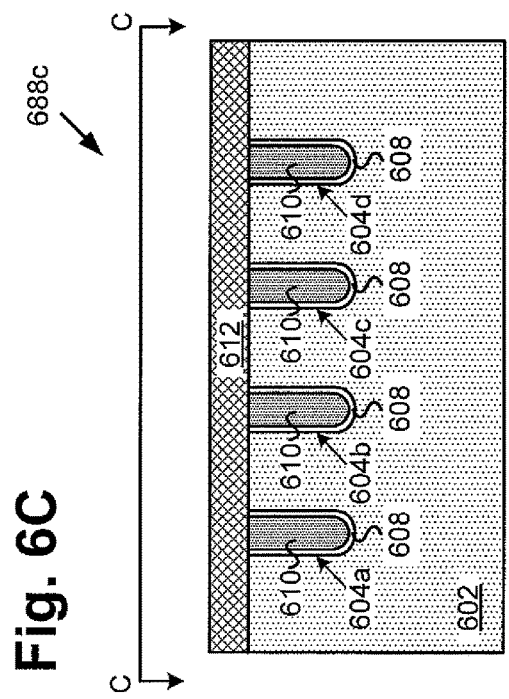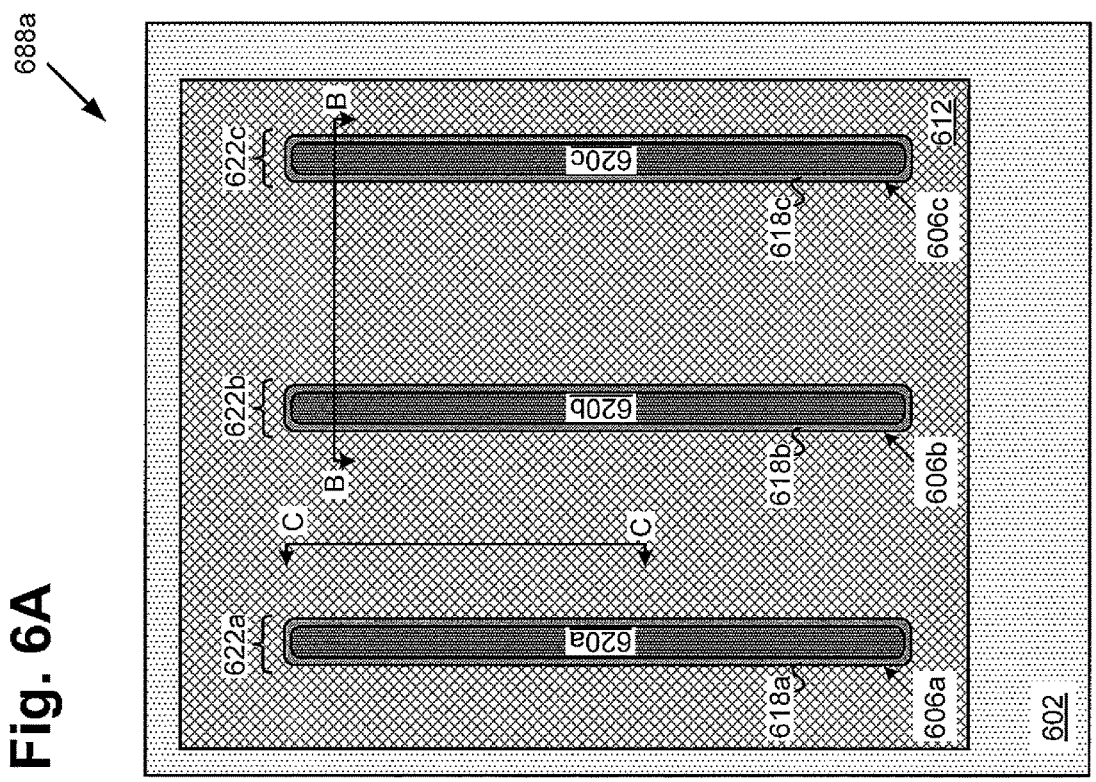

BURIED BUS AND RELATED METHOD

BACKGROUND

Gate resistance can introduce switching losses that can impact the performance of a semiconductor device, such as a metal oxide semiconductor field effect transistor (MOSFET) or an insulated gate bipolar transistor (IGBT). As increasing power density leads to smaller features in active cells, the gate resistance becomes more pertinent to device performance. In a conventional semiconductor device, gate contacts and source contacts are formed in metal one (M1) layer in a dual metal structure over a semiconductor substrate. The gate and source contacts in the M1 layer need to be effectively isolated to prevent electrical shorts. As the power density increases, it has become increasing difficult to effectively isolate the gate and source contacts. In addition, the dual metal structure requires wirebonds to make electrical connections to the gate and source contacts. Wire bonding over a dual metal structure using the existing art with raised or even planarized and segregated metal buses risks breaking the isolation between gate and source creating a short.

Thus, there is a need in the art for a low-resistance gate structure that can effectively remove the need for a dual metal structure and enable a more robust structure for wire bonding.

SUMMARY

The present disclosure is directed to a buried bus and related method, substantially as shown in and/or described in connection with at least one of the figures, and as set forth in the claims.

BRIEF DESCRIPTION OF THE DRAWINGS

FIG. 4A illustrates a top plan view of a portion of a semiconductor structure having a buried bus processed in accordance with an intermediate action in the flowchart of FIG. 1 according to one implementation of the present application.

FIG. 4B illustrates a cross-sectional view of a portion of a semiconductor structure having a buried bus processed in accordance with an intermediate action in the flowchart of FIG. 1 according to one implementation of the present application.

FIG. 4C illustrates a cross-sectional view of a portion of a semiconductor structure having a buried bus processed in accordance with an intermediate action in the flowchart of FIG. 1 according to one implementation of the present application.

FIG. 6A illustrates a top plan view of a portion of a semiconductor structure having a buried bus processed in accordance with a final action in the flowchart of FIG. 1 according to one implementation of the present application.

FIG. 6B illustrates a cross-sectional view of a portion of a semiconductor structure having a buried bus processed in accordance with a final action in the flowchart of FIG. 1 according to one implementation of the present application.

FIG. 6C illustrates a cross-sectional view of a portion of a semiconductor structure having a buried bus processed in accordance with a final action in the flowchart of FIG. 1 according to one implementation of the present application.

DETAILED DESCRIPTION

Figure 1:
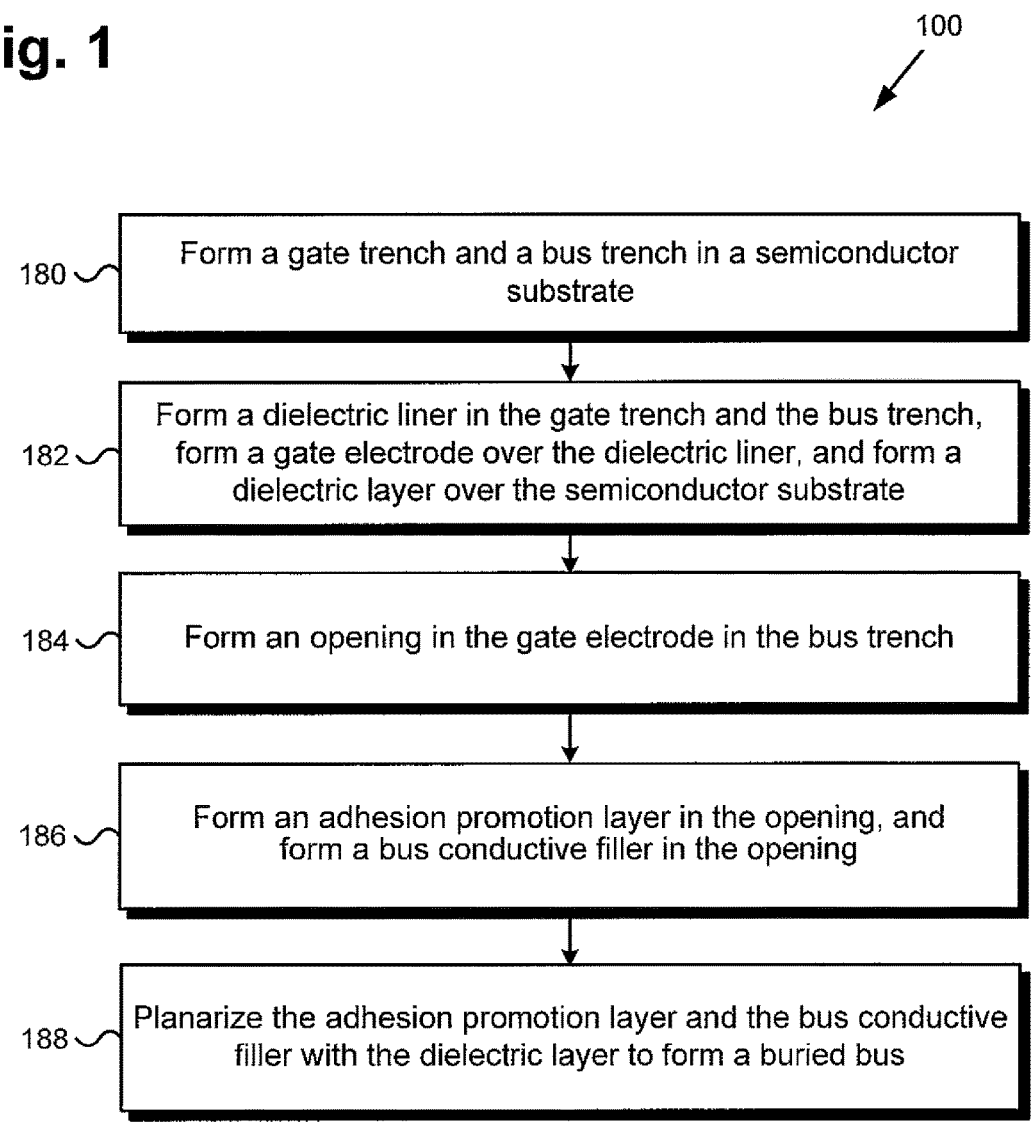
FIG. 1 is a flowchart illustrating a method of forming a semiconductor structure having a buried bus according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a flowchart illustrating a method of forming a semiconductor structure having a buried bus according to implementations of the present application. Certain details and features have been left out of flowchart 100 that are apparent to a person of ordinary skill in the art. For example, an action may consist of one or more subactions or may involve specialized equipment or materials, as known in the art. Actions 180, 182, 184, 186 and 188 indicated in flowchart 100 are sufficient to describe one implementation of the present inventive concepts. Other implementations of the present inventive concepts may utilize actions different from those shown in flowchart 100.

In FIGS. 2A, 2B, 2C, 3A, 3B, 3C, 4A, 4B, 4C, 5A, 5B, 5C, 6A, 6B and 6C, respective semiconductor structures 280a, 280b, 280c, 382a, 382b, 382c, 484a, 484b, 484c, 586a, 586b, 586c, 688a, 688b and 688c illustrate the results of performing actions 180, 182, 184, 186 and 188 of flowchart 100, respectively. For example, semiconductor structures 280a, 280b and 280c show exemplary semiconductor structures after the processing of action 180, semiconductor structures 382a, 382b and 382c show exemplary semiconductor structures after the processing of action 182, semiconductor structures 484a, 484b and 484c show exemplary semiconductor structures after the processing of action 184, and so forth.

Figure 2B:
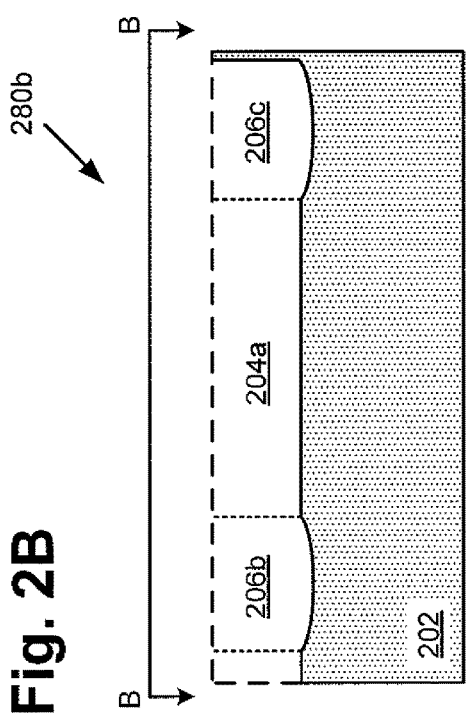
FIG. 2B illustrates a cross-sectional view of a portion of a semiconductor structure having a buried bus processed in accordance with an initial action in the flowchart of FIG. 1 according to one implementation of the present application.
Figure 2C:
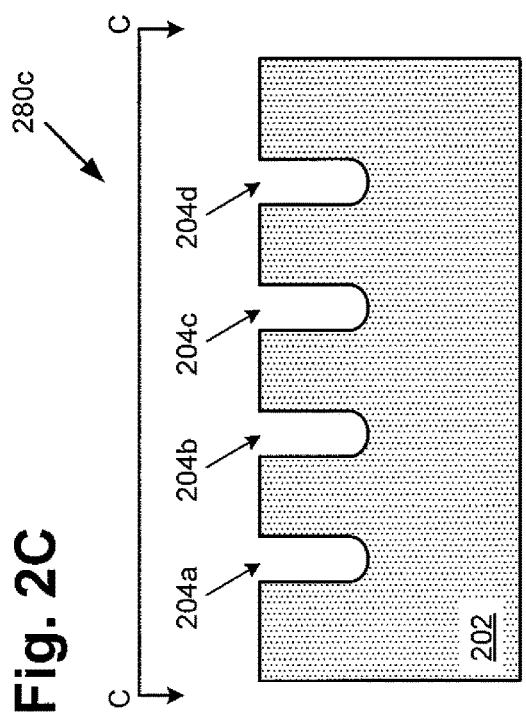
FIG. 2C illustrates a cross-sectional view of a portion of a semiconductor structure having a buried bus processed in accordance with an initial action in the flowchart of FIG. 1 according to one implementation of the present application.
Figure 2A:
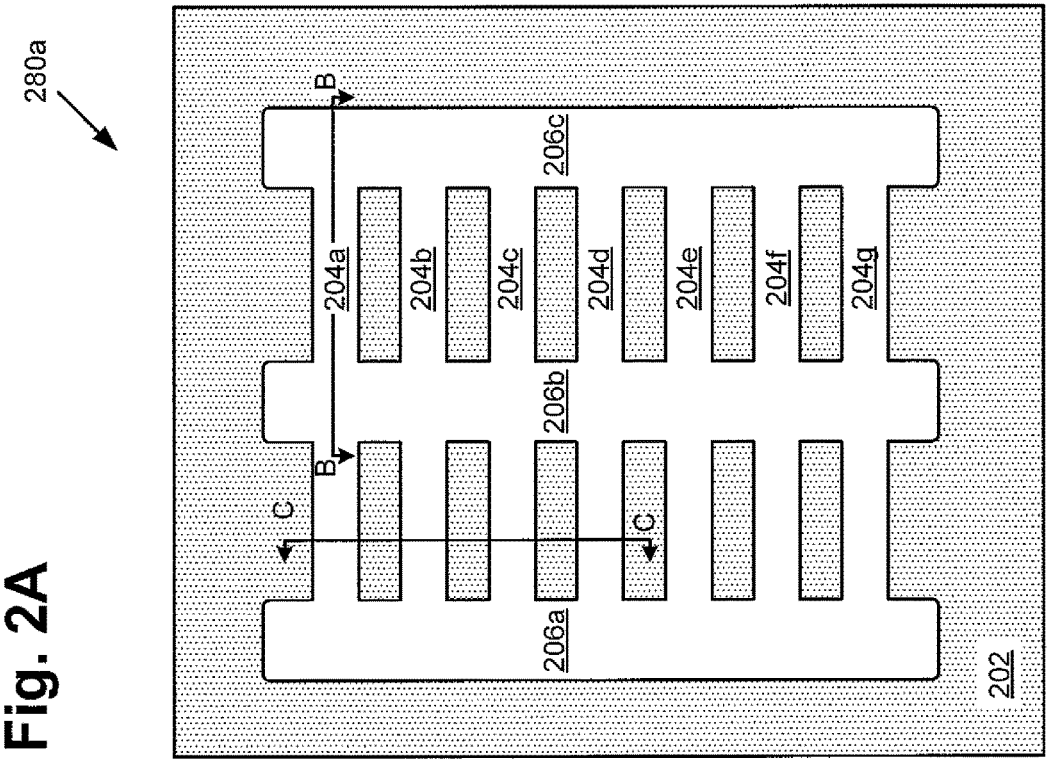
FIG. 2A illustrates a top plan view of a portion of a semiconductor structure having a buried bus processed in accordance with an initial action in the flowchart of FIG. 1 according to one implementation of the present application.

Referring to action 180 in FIG. 1 and semiconductor structures 280a, 280b and 280c (collectively referred to as "semiconductor structure 280") in respective FIGS. 2A, 2B and 2C, action 180 includes forming a gate trench and a bus trench in a semiconductor substrate. Referring to FIG. 2A, semiconductor structure 280a illustrates a top plan view of a portion of a semiconductor structure having a buried bus after completion of action 180 in flowchart 100 of FIG. 1, according to one implementation of the present disclosure. FIG. 2B illustrates a cross-sectional view of exemplary semiconductor structure 280a in FIG. 2A along line B-B, according to one implementation of the present application. FIG. 2C illustrates a cross-sectional view of exemplary semiconductor structure 280a in FIG. 2A along line C-C, according to one implementation of the present application.

As illustrated in FIG. 2A, semiconductor structure 280a includes gate trenches 204a, 204b, 204c, 204d, 204e, 204f and 204g (collectively referred to "gate trenches 204a-204g") in semiconductor substrate 202. Semiconductor structure 280a also includes bus trenches 206a, 206b and 206c (collectively referred to "bus trenches 206a-206c") in semiconductor substrate 202. As illustrated in FIG. 2A, gate trenches 204a-204g are substantially parallel to one another. Bus trenches 206a-206c are substantially parallel to one another, and intersect gate trenches 204a-204g.

In the present implementation, semiconductor substrate 202 includes any suitable semiconductor material, such as silicon. In an implementation, semiconductor substrate 202 may include one or more layers of semiconductor material. For example, semiconductor substrate 202 may include a drain region (not explicitly shown in FIGS. 2A-2C) of a first conductivity type (e.g., N+ type), as a drain of a semiconductor device, such as a MOSFET. Semiconductor substrate 202 may include a drift region (not explicitly shown in FIGS. 2A-2C) of the first conductivity type (e.g., N− type) over the drain region. Semiconductor substrate 202 may also include a body region (not explicitly shown in FIGS. 2A-2C) of a second conductivity (e.g., P type) over the drift region. In one implementation, the drain region and the drift region may include N type dopant, such as Phosphorus or Arsenic, while the body region may include P type dopant, such as Boron. In another implementation, the drain region and the drift region may include P type dopant, while the body region may include N type dopant.

In the present implementation, gate trenches 204a-204g and bus trenches 206a-206c are formed in a single processing action by etching semiconductor substrate 202 using a patterned photoresist layer (not explicitly shown in FIGS. 2A-2C). For example, reactive ion etching (RIE) or other suitable etching methods may be used to form gate trenches 204a-204g and bus trenches 206a-206c. In another implementation, gate trenches 204a-204g and bus trenches 206a-206c may be formed in separate processing actions. A residue clean may be performed to remove residues, impurities and other unwanted material from gate trenches 204a-204g and bus trenches 206a-206c in semiconductor structure 280.

As illustrated in FIG. 2B, bus trenches 206b and 206c (as well as bus trench 206a in FIG. 2A) each include substantially parallel sidewalls extending into a U-shaped bottom. In another implementation, bus trenches 206a-206c may each include sloped sidewalls and/or a flat bottom. As illustrated in FIG. 2C, gate trenches 204a, 204b, 204c and 204d (as well as gate trenches 204e, 204f and 204g in FIG. 2A) each include substantially parallel sidewalls extending into a U-shaped bottom. In another implementation, gate trenches 204a-204g may each include sloped sidewalls and/or a flat bottom.

As illustrated in FIGS. 2A-2C, each of bus trenches 206a-206c has a width that is greater than a width of each of gate trenches 204a-204g. In the present implementation, bus trenches 206a-206c have a substantially uniform depth, that is slightly greater (e.g., 10-15%) than a depth of each of gate trenches 204a-204g. For example, gate trenches 204a-204g and bus trenches 206a-206c may extend through the body region into the drift region of semiconductor substrate 202. In another implementation, bus trenches 206a-206c may have the same width and/or depth as gate trenches 204a-204g. In other implementations, gate trenches 204a-204g and bus trenches 206a-206c may have any appropriate width and depth to suit the specific needs of a particular application.

As illustrated in FIGS. 2A and 2B, each of bus trenches 206a-206c is connected to each of gate trenches 204a-204g. For example, bus trench 206a is connected to each of gate trenches 204a-204g on one end of the gate trenches, while bus trench 206c is connected to each of gate trenches 204a-204g on another end of the gate trenches. Also, bus trench 206b is connected to and intersecting each of gate trenches 204a-204g at approximately the mid point of each of the gate trenches.

Figure 3B:
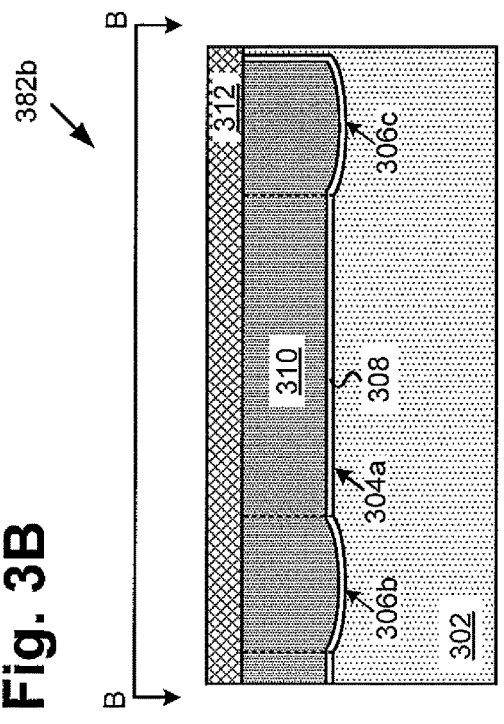
FIG. 3B illustrates a cross-sectional view of a portion of a semiconductor structure having a buried bus processed in accordance with an intermediate action in the flowchart of FIG. 1 according to one implementation of the present application.
Figure 3C:
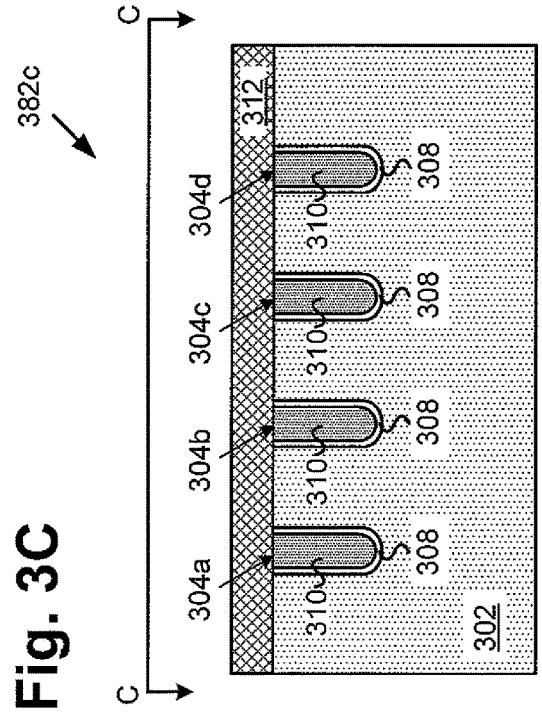
FIG. 3C illustrates a cross-sectional view of a portion of a semiconductor structure having a buried bus processed in accordance with an intermediate action in the flowchart of FIG. 1 according to one implementation of the present application.
Figure 3A:
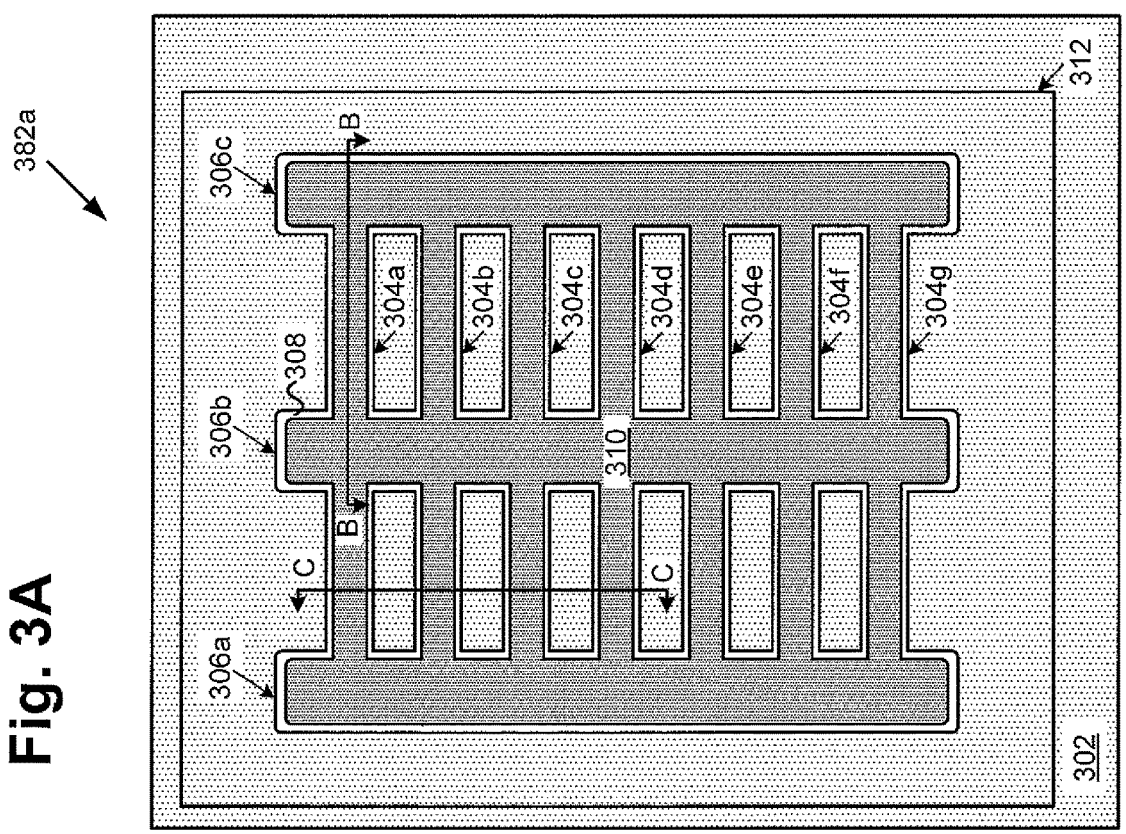
FIG. 3A illustrates a top plan view of a portion of a semiconductor structure having a buried bus processed in accordance with an intermediate action in the flowchart of FIG. 1 according to one implementation of the present application.

Referring to action 182 in FIG. 1 and semiconductor structures 382a, 382b and 382c (collectively referred to as "semiconductor structure 382") in respective FIGS. 3A, 3B and 3C, action 182 includes forming a dielectric liner in the gate trench and the bus trench, forming a gate electrode over the dielectric liner, and forming a dielectric layer over the semiconductor substrate. Referring to FIG. 3A, semiconductor structure 382a illustrates a top plan view of a portion of a semiconductor structure having a buried bus after completion of action 182 in flowchart 100 of FIG. 1, according to one implementation of the present disclosure. FIG. 3B illustrates a cross-sectional view of exemplary semiconductor structure 382a in FIG. 3A along line B-B, according to one implementation of the present application. FIG. 2C illustrates a cross-sectional view of exemplary semiconductor structure 382a in FIG. 2A along line C-C, according to one implementation of the present application.

With similar numerals representing similar features in FIGS. 2A-2C, in FIG. 3A, semiconductor structure 382a includes gate trenches 304a, 304b, 304c, 304d, 304e, 304f and 304g (collectively referred to "gate trenches 304a-304g") and bus trenches 306a, 306b and 306c (collectively referred to "bus trenches 306a-306c") in semiconductor substrate 302. As illustrated in FIG. 3A, semiconductor structure 382a includes dielectric liner 308 and gate electrode 310 over dielectric liner 308 in gate trenches 304a-304g and bus trenches 306a-306c. Dielectric layer 312, which is rendered transparent in FIG. 3A for clarity, is a blanket dielectric layer over semiconductor substrate 302 and covers gate trenches 304a-304g and bus trenches 306a-306c.

As illustrated in FIGS. 3A-3C, dielectric liner 308 lines the sidewalls and the bottom of each of gate trenches 304a-304g and bus trenches 306a-306c. For example, dielectric liner 308 may be formed by depositing and/or thermally growing a dielectric material in gate trenches 304a-304g and bus trenches 306a-306c. In the present implementation, dielectric liner 308 includes silicon dioxide. In another implementation, dielectric liner 308 may include other suitable dielectric material, such as a nitride material (e.g., silicon nitride) or tetraethylorthosilicate (TEOS).

As illustrated in FIGS. 3A-3C, gate electrode 310 is formed over dielectric liner 308 in each of gate trenches 304a-304g and bus trenches 306a-306c. For example, gate electrode 310 may be formed by depositing a conductive material over dielectric liner 308 in gate trenches 304a-304g and bus trenches 306a-306c such that gate electrode 310 in each of gate trenches 304a-304g are interconnected with gate electrode 310 in each of bus trenches 306a-306c. In the present implementation, gate electrode 310 includes polycrystalline silicon. In another implementation, gate electrode 310 may include other suitable conductive material, such as metals or metal alloys.

As illustrated in FIGS. 3A-3C, dielectric layer 312 is formed over semiconductor substrate 302 and covers dielectric liner 308 and gate electrode 310 in gate trenches 304a-304g and bus trenches 306a-306c. For example, dielectric layer 312 may be formed by depositing and/or thermally growing a dielectric layer over semiconductor substrate 302. In the present implementation, dielectric layer 312 includes silicon dioxide. In another implementation, dielectric layer 312 may include other suitable dielectric material, such as a nitride material (e.g., silicon nitride) or tetraethylorthosilicate (TEOS).

It should be understood that after the formations of dielectric liner 308 and gate electrode 310, a planarization process, such as Chemical Mechanical Polishing (CMP), may be performed to planarize dielectric liner 308 and gate electrode 310 with semiconductor substrate 302 before the formation of dielectric layer 312.

Referring to action 184 in FIG. 1 and semiconductor structures 484a, 484b and 484c (collectively referred to as "semiconductor structure 484") in respective FIGS. 4A, 4B and 4C, action 184 includes forming an opening in the gate electrode in the bus trench. Referring to FIG. 4A, semiconductor structure 484a illustrates a top plan view of a portion of a semiconductor structure having a buried bus after completion of action 184 in flowchart 100 of FIG. 1, according to one implementation of the present disclosure. FIG. 4B illustrates a cross-sectional view of exemplary semiconductor structure 484a in FIG. 4A along line B-B, according to one implementation of the present application. FIG. 4C illustrates a cross-sectional view of exemplary semiconductor structure 484a in FIG. 4A along line C-C, according to one implementation of the present application.

With similar numerals representing similar features in FIGS. 3A-3C, in FIG. 4A, semiconductor structure 484a includes gate trenches 404a, 404b, 404c, 404d, 404e, 404f and 404g (collectively referred to "gate trenches 404a-404g") and bus trenches 406a, 406b and 406c (collectively referred to "bus trenches 406a-406c") in semiconductor substrate 402. As illustrated in FIG. 4A, semiconductor structure 484a includes dielectric liner 408 and gate electrode 410 over dielectric liner 408 in gate trenches 404a-404g and bus trenches 406a-406c. Dielectric layer 412 and photoresist layer 414, which are rendered transparent in FIG. 4A for clarity, are over semiconductor substrate 402 and covers gate trenches 404a-404g and portions of bus trenches 406a-406c. Semiconductor structure 484a also includes openings 416a, 416b and 416c (collectively referred to "openings 416a-416c") formed in gate electrode 410 in respective bus trenches 406a, 406b and 406c.

As illustrated in FIGS. 4A and 4B, photoresist layer 414 is formed and patterned over dielectric layer 412. Openings 416a-416c are formed by removing portions of dielectric layer 412 and gate electrode 410 in bus trenches 406a-406c, respectively, for example, by RIE or other suitable etching methods. As illustrated in FIG. 4B, openings 416b and 416c (as well as opening 416a in FIG. 4A) extend through photoresist layer 414 and dielectric layer 412 into gate electrode 410. It should be noted that each of openings 416a-416c terminates within gate electrode 410, such that gate electrode 410 remains on the sidewalls and the bottom of each of bus trenches 406a-406c. Since openings 416a-416c do not extend through the entire thickness of gate electrode 410 in respective bus trenches 406a-406c, dielectric liner 408 at the bottom of each of bus trenches 406a-406c is not damaged during the formation of openings 416a-416c. As can be seen in FIG. 4C, dielectric liner 408 and gate electrode 410 in gate trenches 404a, 404b, 404c and 404d (as well as gate trenches 404e, 404f and 404g in FIG. 4A) remain covered by dielectric layer 412 during action 184 of flowchart 100.

Figure 5B:
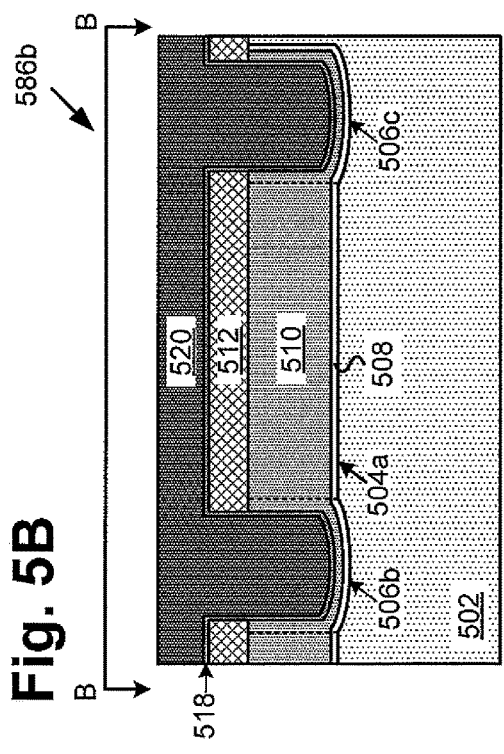
FIG. 5B illustrates a cross-sectional view of a portion of a semiconductor structure having a buried bus processed in accordance with an intermediate action in the flowchart of FIG. 1 according to one implementation of the present application.
Figure 5C:
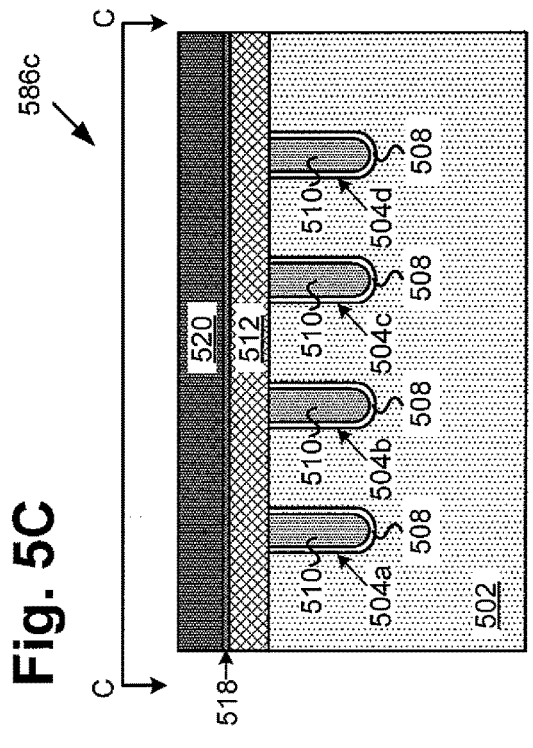
FIG. 5C illustrates a cross-sectional view of a portion of a semiconductor structure having a buried bus processed in accordance with an intermediate action in the flowchart of FIG. 1 according to one implementation of the present application.
Figure 5A:
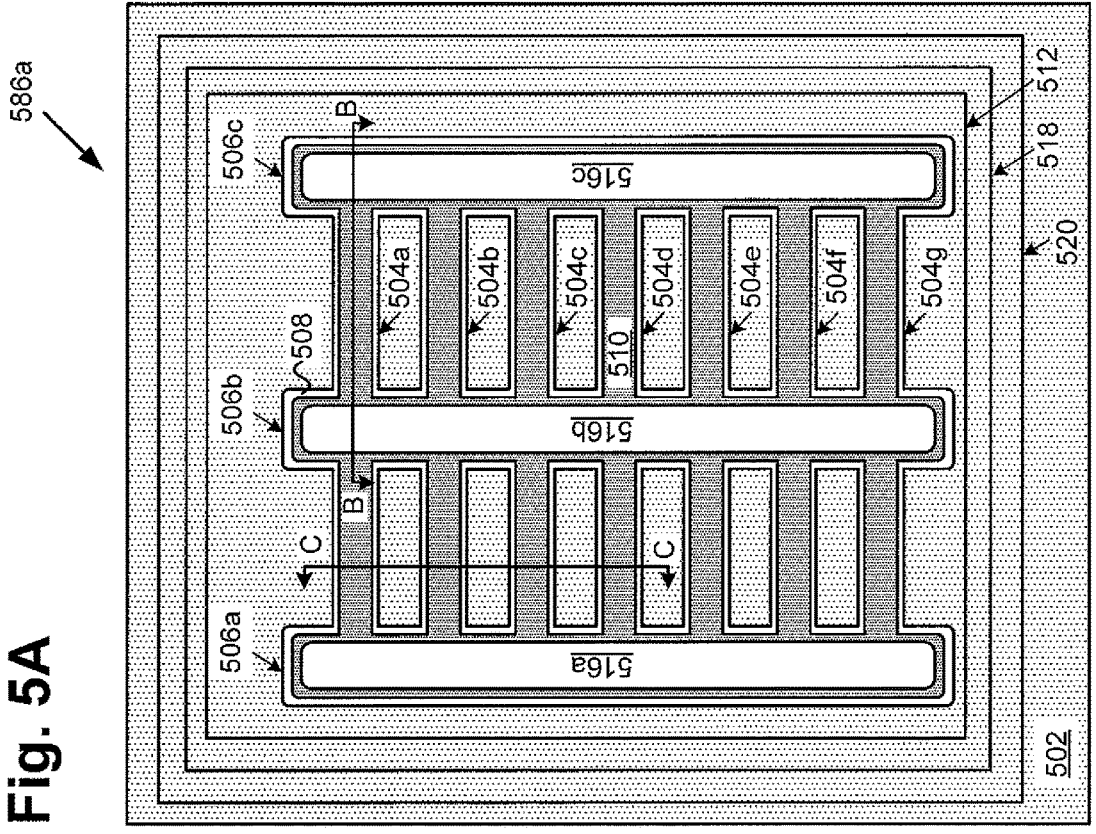
FIG. 5A illustrates a top plan view of a portion of a semiconductor structure having a buried bus processed in accordance with an intermediate action in the flowchart of FIG. 1 according to one implementation of the present application.

Referring to action 186 in FIG. 1 and semiconductor structures 586a, 586b and 586c (collectively referred to as "semiconductor structure 586") in respective FIGS. 5A, 5B and 5C, action 186 includes forming an adhesion promotion layer in the opening, and forming a bus conductive filler in the opening. Referring to FIG. 5A, semiconductor structure 586a illustrates a top plan view of a portion of a semiconductor structure having a buried bus after completion of action 186 in flowchart 100 of FIG. 1, according to one implementation of the present disclosure. FIG. 5B illustrates a cross-sectional view of exemplary semiconductor structure 586a in FIG. 5A along line B-B, according to one implementation of the present application. FIG. 5C illustrates a cross-sectional view of exemplary semiconductor structure 586a in FIG. 5A along line C-C, according to one implementation of the present application.

With similar numerals representing similar features in FIGS. 4A-4C, in FIG. 5A, semiconductor structure 586a includes gate trenches 504a, 504b, 504c, 504d, 504e, 504f and 504g (collectively referred to "gate trenches 504a-504g") and bus trenches 506a, 506b and 506c (collectively referred to "bus trenches 506a-506c") in semiconductor substrate 502. As illustrated in FIG. 5A, semiconductor structure 586a includes dielectric liner 508 and gate electrode 510 over dielectric liner 508 in gate trenches 504a-504g and bus trenches 506a-506c. Dielectric layer 512, which is rendered transparent in FIG. 5A for clarity, is over semiconductor substrate 502. Adhesion promotion (AP) layer 518 and bus conductive filler 520, which are rendered transparent in FIG. 5A for clarity, are formed in openings 516a, 516b and 516c (collectively referred to "openings 516a-516c") and over dielectric layer 512.

In the present implementation, after photoresist layer 414 is removed from semiconductor structure 484 in FIGS. 4A-4C, AP layer 518 is formed in openings 516a-516c and over dielectric layer 512 before the formation of bus conductive filler 520 to improve adhesion between gate electrode 510 and bus conductive filler 520. In the present implementation, AP layer 518 includes titanium and titanium nitride. In other implementations, AP layer 518 may include other suitable conductive material for promoting adhesion between gate electrode 510 and bus conductive filler 520 in each of bus trenches 506a-506c. In another implementation, AP layer 518 may be optionally omitted.

In the present implementation, bus conductive filler 520 is formed over AP layer 518 in openings 516a, 516b and 516c and over dielectric layer 512. For example, bus conductive filler 520 may be formed over AP layer 518 using physical vapor deposition (PVD), chemical vapor deposition (CVD), plasma enhanced chemical vapor deposition (PECVD), thermal CVD, or spin-coating. In the present implementation, bus conductive filler 520 includes a conductive material having a low resistance and a high melting point, such as tungsten. In other implementations, bus conductive filler 520 may include other suitable conductive material. As illustrated in FIG. 5B, bus conductive filler 520 is surrounded by and electrically connected to gate electrode 510 in each of bus trenches 506b and 506c (as well as bus trench 506a in FIG. 5A). As can be seen in FIG. 5C, AP layer 518 and bus conductive filler 520 are also formed over dielectric liner 508 and gate electrode 510 in gate trenches 504a, 504b, 504c and 504d (as well as gate trenches 504e, 504f and 504g in FIG. 5A), which are covered by dielectric layer 512 during action 186 of flowchart 100.

Referring to action 188 in FIG. 1 and semiconductor structures 688a, 688b and 688c (collectively referred to as "semiconductor structure 688") in respective FIGS. 6A, 6B and 6C, action 188 includes planarizing the adhesion promotion layer and the bus conductive filler with the dielectric layer to form a buried bus. Referring to FIG. 6A, semiconductor structure 688a illustrates a top plan view of a portion of a semiconductor structure having a buried bus after completion of action 188 in flowchart 100 of FIG. 1, according to one implementation of the present disclosure. FIG. 6B illustrates a cross-sectional view of exemplary semiconductor structure 688a in FIG. 6A along line B-B, according to one implementation of the present application. FIG. 6C illustrates a cross-sectional view of exemplary semiconductor structure 688a in FIG. 6A along line C-C, according to one implementation of the present application.

With similar numerals representing similar features in FIGS. 5A-5C, in FIGS. 6A-6C, semiconductor structure 688 includes gate trenches 604a, 604b, 604c and 604d (collectively referred to "gate trenches 604a-604d") and bus trenches 606a, 606b and 606c (collectively referred to "bus trenches 606a-606c") in semiconductor substrate 602. It should be understood that semiconductor structure 688 may also include other gate trenches (not explicitly shown in FIGS. 6A-6C), such as gate trenches 504e, 504f and 504g in FIG. 5A, under dielectric layer 612. Semiconductor structure 688 includes dielectric liner 608 and gate electrode 610 over dielectric liner 608 in gate trenches 604a-604d and bus trenches 606a-606c. Buried buses 622a, 622b and 622c (collectively referred to "buried buses 622a-622c") are formed in semiconductor substrate 602 and have a coplanar top surface with dielectric layer 612. For example, buried bus 622a includes conductive filler 620a and AP layer 618a, which are surrounded by gate electrode 610 in bus trench 606a. Similarly, buried buses 622b and 622c include conductive fillers 620b and 620c, and AP layers 618b and 618c, respectively, which are surrounded by gate electrode 610 in respective bus trenches 606b and 606c.

As illustrated in FIGS. 6A-6C, the excess bus conductive filler and AP layer (e.g., bus conductive filler 520 and AP layer 518 in FIGS. 5A-5C) over dielectric layer 612 are removed from semiconductor structure 688 by using, for example, CMP. As such, AP layers 618a, 618b, and 618c, and bus conductive fillers 620a, 620b and 620c in respective bus trenches 606a, 606b and 606c have a coplanar top surface with dielectric layer 612, as shown in FIGS. 6A-6C. As illustrated in FIG. 6B, each of buried buses 622b and 622c (as well as buried bus 622a in FIG. 6A) is surrounded by and electrically connected to gate electrode 610 in each of bus trenches 606a-606c.

In the present implementation, gate electrode 610 in gate trenches 604a-604d (as well as in other gate trenches under dielectric layer 612) and buried buses 622a-622c in semiconductor structure 688 may be a gate structure of a substantially vertical conduction semiconductor device, such as a MOSFET, a bipolar junction transistor (BJT) or an insulated gate bipolar transistor (IGBT). It should be understood that a source and a drain region (not explicitly shown in FIGS. 6A-6C) may be formed on the respective top and bottom sides of semiconductor substrate 602, thus forming a substantially vertical conduction power semiconductor device. In an other implementation, gate electrode 610 in gate trenches 604a-604d (as well as in other gate trenches under dielectric layer 612) and buried buses 622a-622c in semiconductor structure 688 may be a gate structure for any type of semiconductor device, in which the gate is buried into the semiconductor substrate, including substantially lateral conduction semiconductor devices.

In the present implementation, since gate electrode 610 in gate trenches 604a-604d makes electrical and mechanical contact with buried buses 622a-622c in bus trenches 606a-606c, respectively, gate electrode 610 and buried buses 622a-622c may only require one or a few gate pads on a subsequently formed metal one (M1) layer over dielectric layer 612 for gate connection. As a result, source contacts may be formed in the M1 layer without requiring a complex dual metal structure. Since the M1 layer may only contain one or a few gate pads, effective electrical isolation between the gate pads and the source contacts can be achieved. In addition, gate electrode 610 and buried buses 622a-622c may also enable a more robust structure for wire bonding in the M1 layer.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:
1. A semiconductor structure, comprising:
a semiconductor substrate having a gate electrode in a gate trench;
a buried bus in said semiconductor substrate, said buried bus having a bus conductive filler in a bus trench;
a dielectric liner in said gate trench and said bus trench; and
an adhesion promotion layer in said bus trench and interposed between said bus conductive filler and said gate electrode, wherein said bus conductive filler is electrically coupled to said gate electrode.

2. The semiconductor structure of claim 1, wherein said bus conductive filler is surrounded by said gate electrode.

3. The semiconductor structure of claim 1, wherein said gate trench intersects said bus trench in said semiconductor substrate.

4. The semiconductor structure of claim 1, wherein said gate electrode comprises polysilicon.

5. The semiconductor structure of claim 1, wherein said bus conductive filler comprises tungsten.

6. The semiconductor structure of claim 1, wherein said adhesion promotion layer comprises titanium and titanium nitride.

7. The semiconductor structure of claim 1, further comprising a dielectric layer covering said gate electrode over said semiconductor substrate.

8. The semiconductor structure of claim 1, wherein said bus conductive filler comprises a different material than said gate electrode.

9. The semiconductor structure of claim 7, wherein said buried bus has a coplanar top surface with said dielectric layer.

10. A method of forming a semiconductor structure, said method comprising:
    forming a gate trench and a bus trench in a semiconductor substrate, said gate trench connected to said bus trench;
    forming a dielectric liner in said gate trench and said bus trench;
    forming a gate electrode in said gate trench and said bus trench;
    forming an opening in said gate electrode in said bus trench;
    forming a bus conductive filler in said opening, thereby forming a buried bus; and
    forming an adhesion promotion layer in said bus trench and interposed between said bus conductive filler and said gate electrode,
    wherein said bus conductive filler is electrically coupled to said gate electrode.

11. The method of claim 10, further wherein said bus conductive filler is surrounded by said gate electrode.

12. The method of claim 10, further comprising forming a dielectric layer over said semiconductor substrate.

13. The method of claim 10, wherein said gate electrode comprises polysilicon.

14. The method of claim 10, wherein said bus conductive filler comprises tungsten.

15. The method of claim 10, wherein said adhesion promotion layer comprises titanium and titanium nitride.

16. The method of claim 10, wherein said bus trench has a width that is greater than that of said gate trench.

17. The method of claim 12, further comprising planarizing said bus conductive filler such that said bus conductive filler having a coplanar top surface with said dielectric layer.

18. A semiconductor structure, comprising:
    a semiconductor substrate having a gate electrode in a gate trench;
    a buried bus in said semiconductor substrate, said buried bus having a bus conductive filler in a bus trench; and
    a dielectric layer over and in contact with said semiconductor substrate,
    wherein said gate electrode extends to and terminates at a first surface of said dielectric layer, said first surface facing said semiconductor substrate,
    wherein said bus conductive filler extends to and terminates at a second surface of said dielectric layer opposite said first surface,
    wherein said gate trench runs perpendicular to said bus trench,
    wherein said bus conductive filler is electrically coupled to said gate electrode.

* * * * *